(12) United States Patent
Aebersold

(10) Patent No.: US 9,569,946 B2
(45) Date of Patent: Feb. 14, 2017

(54) SMOKE ALARM ACCORDING TO THE SCATTERED LIGHT PRINCIPLE HAVING A TWO-COLOR LIGHT-EMITTING DIODE WITH DIFFERENT SIZES OF LED CHIPS

(71) Applicant: SIEMENS SCHWEIZ AG, Zurich (CH)

(72) Inventor: Hans Aebersold, Bonstetten (CH)

(73) Assignee: Siemens Schweiz AG, Zurich (CH)

( * ) Notice: Subject to any disclaimer, the term of this patent is extended or adjusted under 35 U.S.C. 154(b) by 55 days.

(21) Appl. No.: 14/621,464

(22) Filed: Feb. 13, 2015

(65) Prior Publication Data

US 2015/0228171 A1    Aug. 13, 2015

(30) Foreign Application Priority Data

Feb. 13, 2014  (EP) ..................................... 14155048

(51) Int. Cl.
| | | |
|---|---|---|
| *G08B 21/00* | (2006.01) | |
| *G08B 17/107* | (2006.01) | |
| *G08B 17/113* | (2006.01) | |

(52) U.S. Cl.
CPC ........... *G08B 17/107* (2013.01); *G08B 17/113* (2013.01)

(58) Field of Classification Search
CPC ...... G08B 17/107; G08B 17/103; G08B 17/10
USPC ....................................................... 340/630
See application file for complete search history.

(56) References Cited

U.S. PATENT DOCUMENTS

| | | | |
|---|---|---|---|
| 6,011,478 A | 1/2000 | Suzuki et al. | |
| 6,107,925 A * | 8/2000 | Wong ..................... | G08B 17/10 340/628 |
| 6,377,345 B1 * | 4/2002 | Powell ................. | G08B 17/107 250/574 |
| 8,328,387 B2 | 12/2012 | Hying et al. | |
| 2004/0000867 A1 | 1/2004 | Chen | |
| 2009/0080185 A1 | 3/2009 | McMillan | |
| 2010/0066253 A1 * | 3/2010 | Hying ................ | H05B 33/0803 315/113 |
| 2011/0037971 A1 | 2/2011 | Loepfe et al. | |

(Continued)

FOREIGN PATENT DOCUMENTS

| | | |
|---|---|---|
| CN | 1224206 A | 7/1999 |
| CN | 101548581 A | 9/2009 |

(Continued)

*Primary Examiner* — Mark Rushing
(74) *Attorney, Agent, or Firm* — Laurence Greenberg; Werner Stemer; Ralph Locher

(57) ABSTRACT

An optical smoke alarm contains a detector unit that works according to the scattered light principle with a light-emitting diode to irradiate particles to be detected and a photo sensor which is spectrally sensitive thereto to detect the light scattered by the particles. The light-emitting diode contains a first LED chip being a surface-emitting radiator for emitting a first light bundle with light in a first wavelength range of from 350 nm to 500 nm. It contains a second LED chip being a surface-emitting radiator for emitting a second light bundle with light in a second wavelength range of from 665 nm to 1000 nm. The two LED chips are arranged next to each other. A ratio of the optically active surface of the first LED chip to the optically active surface of the second LED chip is within a range of from 2 to 20.

17 Claims, 4 Drawing Sheets

(56) References Cited

U.S. PATENT DOCUMENTS

2014/0042467 A1* 2/2014 Livesay ............... H01L 33/642
                                                                  257/88

FOREIGN PATENT DOCUMENTS

| CN | 101952863 A | 1/2011 |
|---|---|---|
| EP | 0877345 A2 | 11/1998 |
| WO | 2008086890 A1 | 7/2008 |

\* cited by examiner

SMOKE ALARM ACCORDING TO THE SCATTERED LIGHT PRINCIPLE HAVING A TWO-COLOR LIGHT-EMITTING DIODE WITH DIFFERENT SIZES OF LED CHIPS

CROSS-REFERENCE TO RELATED APPLICATION

This application claims the priority, under 35 U.S.C. §119, of European application EP 14155048.3, filed Feb. 13, 2014; the prior application is herewith incorporated by reference in its entirety.

BACKGROUND OF THE INVENTION

Field of the Invention

The invention relates to an optical smoke alarm with a detector unit that works according to the scattered light principle.

Smoke alarms of this type are also known as fire alarms. They typically contain a housing with at least one smoke-inlet opening and the detector unit accommodated in the housing for the smoke detection. The detector unit preferably contains an optical measuring chamber, which is shielded against ambient light, but permeable to smoke to be detected. The latter typically also contains a plurality of louvers to shield ambient light and is therefore also called a labyrinth.

The detector unit in question contains a light-emitting diode to irradiate particles to be detected and a photo sensor which is spectrally sensitive thereto to detect the light scattered by the particles. Typically an electronic control unit is also connected to the light-emitting diode and the photo sensor as part of the smoke alarm. The control unit is configured to output a warning and/or an alarm if a respective minimum concentration value of smoke can be detected.

Published, European patent application EP 0 877 345 A2, corresponding to U.S. Pat. No. 6,011,478, discloses a scattered-light smoke alarm containing a light-emission device to emit light with two different wavelengths, a light-receiving device to receive scattered light with the two different wavelengths, a calculating device for performing a calculation necessary for the smoke detection from a scattered light output of the first wavelength and a scattered light output of the second wavelength of the light-receiving device and a smoke-detection processing device for performing a smoke-detection process on the basis of a calculation result output from the calculating device. According to an embodiment therein according to FIG. 13, the use of a light-emission device, i.e. a two-color light-emitting diode is known, in which a first and second light-emission device are arranged at positions very close to one another and emit the light of the first and second wavelengths in the same light-emission direction.

Also known from the prior art are detector units that use two differently colored light-emitting diodes and a photo sensor in one or two scattered-light arrangements. It is known to use a red-luminous LED or an infrared LED to emit the red or infrared light and to use a blue or violet-luminous LED to emit blue or violet light. By means of a suitable evaluation of the respective colored scattered light received from the photo sensor, it is then possible to perform an evaluation with respect to the particle size of the smoke particles detected. A suitable assessment of the particle sizes detected enables, for example, a differentiation to be made between smoke, dust and steam. This enables the output of a possible false alarm to be prevented.

The known smoke alarms are typically configured for operation in a line of alarms with a plurality of further smoke alarms connected thereto or for battery-supported stand-alone operation. This means in both cases that only a very small average electrical power of less than 10 mW is available. The control of the light-emitting diodes for the emission of the respective light is, therefore, typically pulsed. Similarly, the entire "electronics" are adapted for the lowest possible power consumption.

SUMMARY OF THE INVENTION

On the basis of the prior art cited in the introduction, it is an object of the invention to specify a smoke alarm with an improved detector unit.

With the foregoing and other objects in view there is provided, in accordance with the invention, an optical smoke alarm. The optical smoke alarm contains a detector unit working according to a scattered light principle and a light-emitting diode for irradiating particles to be detected and disposed in the detector unit. The light-emitting diode has a first LED chip being a surface-emitting radiator for emitting a first light bundle with light in a first wavelength range of from 350 nm to 500 nm. The light-emitting diode has a second LED chip being a surface-emitting radiator for emitting a second light bundle with light in a second wavelength range of from 665 nm to 1000 nm. The first and second LED chips are disposed next to each other. A ratio of an optically active surface of the first LED chip to an optically active surface of the second LED chip is within a range of from 2 to 20. A spectrally sensitive photosensor to detect light scattered by the particles is provided and disposed in the detector unit.

According to the invention, the light-emitting diode contains a first LED chip embodied as a surface-emitting radiator to emit a first light bundle with light in a first wavelength range of from 350 nm to 500 nm. It also contains a second LED chip embodied as a surface-emitting radiator to emit a second light bundle with light in a second wavelength range of from 665 nm to 1000 nm. Here, the respective light emitted by the LED chips is mainly monochromatic light.

Here, "surface-emitting radiator" means that the light is emitted from a level surface with Lambertian light distribution. Hence, the surface-emitting radiators could also be called Lambertian radiators. Alternatively, the first and second LED chip may be embodied as edge-emitting radiators.

The two LED chips are arranged next to each other.

Alternatively, the two LED chips can be arranged at least partially overlapping. It is also possible for the first LED chip, which is much smaller than the second LED chip, to be arranged on the second LED chip, in particular in the middle or center thereof.

The LED chips are usually made from a wafer with a plurality of LED chips produced in an optoelectronic semiconductor process. A wafer of this kind is separated by mechanical separating processes, in particular by sawing or breaking, into the plurality of LED chips. A "naked" and per se fully functional component is also known as a "die". It therefore contains a typically square or rectangular shape.

In addition, according to the invention, the ratio of the optically active surface of the first LED chip to the optically active surface of the second LED chip is within a range of from 2 to 20. Hence, the first LED chip emits light in the blue-green, blue, violet or ultraviolet range while the second LED chip emits light in the red/orange, red or infrared range.

According to one advantageous embodiment, the ratio of the optically active surface of the first LED chip to the optically active surface of the second LED chip is within a range of from 2.5 to 6.5.

"Optically active" means the parts of the surface of the LED chips that emit light on current excitation. Hence, regions for the contacting of the LED chips on the surface, which are, for example, intended for contacting a bonding wire, do not belong thereto.

The core of the invention consists, on the one hand, in the integration of two single-colored light-emitting diodes to form one single (only) two-color light-emitting diode.

This advantageously reduces the number of components. A further advantage consists in the fact that it is possible to dispense with complex calibration of the optical path following the assembly of the two-color light-emitting diode. Usually, the relative deviations in alignment and position in relation to each other that occur with the assembly of two light-emitting diodes require complex calibration.

On the other hand, the invention is based on the knowledge that above all the "blue" component is the decisive component with respect to the electric power requirement for the optical smoke detection. The reason for this is the significantly poorer efficiency with the generation of blue light compared to red or infrared LED-light. Typically, the generation of blue or violet light is worse than the generation of red or infrared light by about a factor of 10. For example, for the generation of blue light with a wavelength of 470 nm (LED type SFH4570 made by OSRAM), approximately 11 times more optically active surface is required for the same radiation intensity compared to the generation of infrared light with a wavelength of 940 nm (LED type SFH4550 made by OSRAM).

Another factor is the significantly poorer spectral sensitivity of blue light in the case of silicon PIN photodiodes, which are usually used as photo sensors. So, assuming the above-described exemplary OSRAM LEDs, the detection of blue light is worse than the detection of infrared light by a factor of 1.7 (see in this context FIG. 5). For the entire electrically-optically electric efficiency, the resulting total factor is about 19=11×1.7.

According to the invention, the optically active surface of the blue-illuminating LED chip is dimensioned such that a photo sensor signal of adequate quality for reliable smoke detection is ensured. On the other hand, due to the significantly better electrically-optically electric efficiency of the "red" component, the surface of the "red" LED chip for the generation of the red or infrared light can be reduced to a fraction. This advantageously results in a reduction of the electrical power requirement and the costs of a two-color LED of this kind.

According to one embodiment, the first LED chip is embodied to emit light with a wavelength of 460 nm±40 nm or 390 nm±40 nm, and the second LED chip to emit light with a wavelength of 940 nm±40 nm or 860 nm±40 nm.

The light-emitting diode preferably has an axis of symmetry. The respective main direction of radiation of the two LED chips is parallel toward the axis of symmetry. The axis of symmetry can also be designated the main structural axis or longitudinal axis. In the case of the customary 5 mm or 3 mm light-emitting diodes that are sold "off the shelf", that is as mass-produced consumer products, this is the rotational axis of symmetry relative to the plastic housing of such light-emitting diodes.

The two LED chips are applied on a supporting plate of the light-emitting diode and connected to the electric connections leading out of the plastic housing. In this case, the surface normal of the supporting plate extends parallel to the axis of symmetry of the light-emitting diode.

Alternatively to this, at least one of the main directions of radiation is inclined toward the axis of symmetry. This enables focusing and/or optical guidance of the respective light bundle generated.

According to one embodiment, a diaphragm mechanism with a diaphragm aperture is arranged in the detector unit between the light-emitting diode and the photo sensor. The diaphragm aperture formed is typically rectangular, but can also be round. The diaphragm mechanism is arranged and aligned such that the light bundles emitted by the two LED chips pass substantially completely through the diaphragm aperture.

Here, "substantially completely" means that more than 95% of the total amount of light emitted by the respective LED chips passes through the diaphragm aperture. The technical background is that, outside the idealized light bundles or light bundle boundaries shown there is always some residual light or scattered light that cannot be completely avoided. This residual light is now effectively shielded to avoid direct LED light on the photo sensor.

According to an alternative embodiment to the previous embodiment, the diaphragm mechanism is arranged and aligned such that less than 75% of the first light bundle emitted by the first LED chip and less than 75% of the second light bundle emitted by the second LED chip pass through the diaphragm aperture. This ensures that assembly-related fitting tolerances of the light-emitting diode with respect to the diaphragm only have a negligible impact on the smoke detection. In particular, the part of the first light bundle that does not pass through the diaphragm aperture illuminates a first part of the diaphragm mechanism adjacent to the diaphragm aperture, while the part of the second light bundle that does not pass through the diaphragm aperture illuminates a second part of the diaphragm mechanism adjacent to the diaphragm aperture.

The fact that the two light bundles have a certain illumination reserve in that the respective light bundle also illuminates a part of the diaphragm mechanism means that, despite tilting or rotating of the light-emitting diode, extensively homogeneous illumination of the scattering center is possible. A detector unit of this kind is therefore more mechanically and functionally robust with respect to impact and vibration.

According to one advantageous alternative embodiment to the two previous embodiments, the diaphragm mechanism is arranged and aligned such that the light bundle emitted by one of the LED chips passes substantially completely through the diaphragm aperture, while less than 75% of the light bundle emitted by the other LED chip passes through the diaphragm aperture. This ensures that assembly-related fitting tolerances of the light-emitting diode with respect to the diaphragm only have a negligible impact on the smoke detection.

According to a further embodiment, the light-emitting diode is arranged rotated about the axis of symmetry such that the light emitted by the second LED chip is directed more toward the photo sensor than the light emitted by the first LED chip. This advantageously gives preference to the "blue" component which is weaker with respect to the efficiency chain.

In the combined case in which the "blue" light bundle emitted by the first LED chip passes substantially completely through the diaphragm aperture, while the "red" light bundle emitted by the second LED chip only passes partially through the diaphragm aperture, it is advantageously possible to give preference to the otherwise weaker blue component. This is because a part of the "red" light bundle illuminates a part the diaphragm mechanism instead of the scattered-light center through the diaphragm aperture.

According to a further embodiment, the light-emitting diode contains a housing made of a preferably transparent plastic. Here, "transparent" means that the light emitted originating from the first and second LED chip can pass through the plastic housing. Along the region after the light outlet from the two LED chips, the housing forms an optical lens. Alternatively or additionally, an optical lens unit is arranged between the light-emitting diode and the diaphragm aperture. This enables light bundling and/or light guidance of the light emitted by the two LED chips in the direction toward the scattered light region provided in the detector unit.

According to one advantageous embodiment, the light-emitting diode has a transverse axis extending perpendicular toward the axis of symmetry and through the two LED chips arranged next to each other. A light plane extending through the axis of symmetry and transverse axis is defined. The optical lens or optical lens unit optically defines a focus point lying on the axis of symmetry. In addition, with the focus point as the vertex, a diaphragm angle is defined that extends starting from the axis of symmetry within the light plane. A first and second dimming angle value is determined for the angle of radiation by two opposing inside edges of the diaphragm mechanism bounding the diaphragm aperture. The diaphragm mechanism is aligned and dimensioned such that the two dimming angle values are of different sizes.

According to one embodiment, the diaphragm mechanism is aligned and dimensioned such that the two dimming angle values differ in size from each other by a factor of two to six.

The asymmetric weighting of the two dimming angles with respect to the axis of symmetry enables a preferred greater irradiation with respect to volume of the scattered-light center with light from one of the two LED chips in the detector unit.

This is in particular advantageous in the event that the "red" light emitted by the second LED chip is directed more toward the photosensor than the light emitted by the first LED chip. This gives significant preference to the "blue" component which is weaker with respect to the efficiency chain.

According to one embodiment, the smoke alarm contains an electronic control unit connected to the light-emitting diode and to the photo sensor. The control unit is configured to output a warning and/or an alarm if a respective minimum concentration value of smoke can be detected.

The control unit is preferably a microcontroller. It is configured to control the two LED chips electrically to emit the respective light and synchronized to detect and evaluate the respective electric signal from the photosensor. This determination of the difference or ratio of the two respective received signal amplitudes of the photo sensor assigned to the "color" enables the particle size to be determined. A corresponding comparison preferably of the "blue" signal with a respective minimum concentration value then enables a warning and/or an alarm to be output. The respective processing steps for the temporal control of the two LED chips and the synchronized detection and evaluation of the respective photo sensor signal can be implemented by suitable program steps that can be executed on the microcontroller.

According to one advantageous embodiment, the control unit is configured to control the first LED chip with its specified nominal current. The control unit is also configured to control the second LED chip with a reduction factor that can be defined in comparison with its specified nominal current.

Here, "specified nominal current" means the nominal current value typically specified by the manufacturer of the light-emitting diodes in a data sheet. This advantageously enables a reduction of the electric power required for the operation of the second LED chip. The reason for this is a minimum chip size as a result of the production and assembly technology for the second LED chip, which means for the red-luminous LED chip. The reduction factor, which is typically in the range of 2 to 4, so-to-speak achieves an "electronic reduction" of the chip surface of the second LED chip. In addition, this reduction factor also advantageously enables the calibration of the control for the first and second LED chips.

Preferably, the reduction factor is defined by the different spectral sensitivity of the photo sensor for scattered light to be detected in the first and second wavelength range.

According to a further embodiment, the photo sensor can be a silicon PIN photodiode.

The photo sensor is preferably a silicon PIN photodiode with improved blue sensitivity.

Finally, the electronic control unit can control the two LED chips with alternate pulsing or simultaneous pulsing. In the first case, only one photo sensor is required. In the second case, two photo sensors can be necessary for the respective scattered light to be detected.

Other features which are considered as characteristic for the invention are set forth in the appended claims.

Although the invention is illustrated and described herein as embodied in a smoke alarm according to the scattered light principle having a two-color light-emitting diode with different sizes of led CHIPS, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
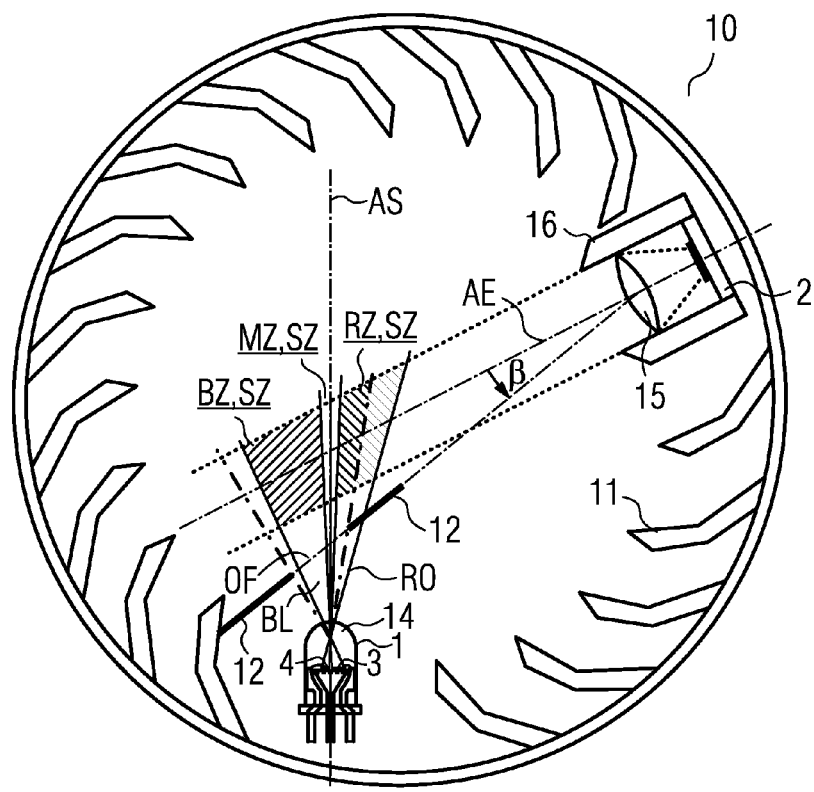
FIG. 1 is an illustration of an exemplary detector unit that works according to the scattered light principle for a smoke alarm with a light-emitting diode and with a photoreceiver according to the invention.

Referring now to the figures of the drawings in detail and first, particularly to FIG. 1 thereof, there is shown an exemplary detector unit 10 that works according to the scattered light principle for a smoke alarm with a light-emitting diode 1 and with a photo receiver 2 according to the invention. For reasons of clarity, the housing of the smoke alarm surrounding the detector unit 10 is not shown. The detector unit 10 contains an optical measuring chamber with a plurality of ambient light-shielding louvers 11. There is also no graphical depiction of smoke inlet openings in the housing and in the detector unit.

Figure 3:
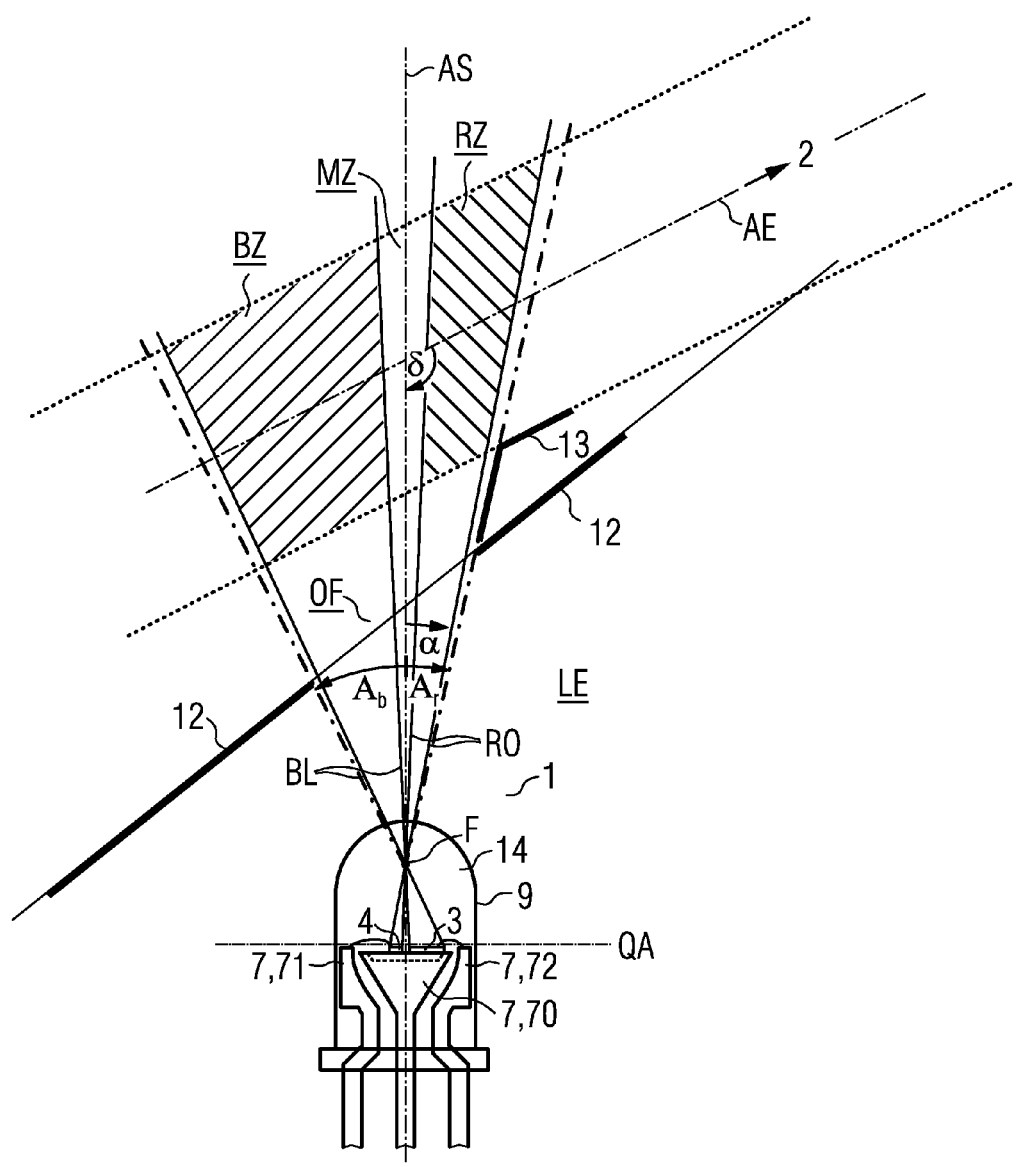
FIG. 3 is an illustration showing the light-emitting diode of FIG. 1 with an upstream alternative diaphragm mechanism.

According to the invention, a (two-color) light-emitting diode 1 with two LED chips 3, 4 and a photo sensor 2 are arranged in the interior of the detector unit 10 in a scattered-light arrangement under an exemplary angle of 120° (see in this context, the scattered light angle δ in the example of FIG. 3). In the present example, the light-emitting diode 1 and the photo sensor 2 are arranged under a forward-scattered light angle. The two components 1, 2 can alternatively also be arranged under a backward-scattered angle for angle values of less than 90°, such as, for example, under a scattered light angle δ of 60°.

The two components are typically electrically connected to a printed circuit board, which is usually located outside the detector unit 10 and adjacent thereto. Further components can be arranged on the printed circuit board such as, for example, a microcontroller, active or passive components.

In the example in FIG. 1, an axis of symmetry AS for the light-emitting diode 1 and an optical receiver axis AE for the photo sensor 2 are plotted. Here, their angle to each other corresponds to the above-described scattered light angle δ. In addition, to avoid direct LED light on the photo sensor 2, a diaphragm mechanism 12 in the form of a pinhole diaphragm is provided upstream of the light-emitting diode 1. Even if this cannot be identified directly in the present example, the pinhole diaphragm 12 forms a rectangular or square diaphragm aperture OF. The latter is formed by two adjacent walls of the detector unit 10, not shown in any further detail, extending parallel to the image plane in FIG. 1 and by the inside edges of the pinhole diaphragm 12 extending in the normal direction to the image plane in FIG. 1.

The light-emitting diode 1 contains a plastic housing, which forms an optical lens 14 for light bundling of the light generated by the light-emitting diode 1 in the direction of the diaphragm aperture OF. The external appearance of the light-emitting diode 1 shown corresponds to that of a typical 5 mm light-emitting diode for a "through-hole assembly" with a diameter of the plastic housing of 5 mm. Alternatively, this can be a 3 mm light-emitting diode. It can also be alternatively embodied for the surface assembly, i.e. as an SMD light-emitting diode.

The photo sensor 2 shown is also surrounded by a receiver dimming mechanism 16. There is also a receiver lens 15 for focusing scattered light from smoke particles to be detected upstream of the photo sensor 2. In addition, the two walls, not shown in further detail, of the diaphragm mechanism 12 are aligned toward the geometric center of the receiver lens 15 under a shielding angle β.

The optical imaging arrangement containing the light-emitting diode 1 and the opposing diaphragm mechanism 12 on the one hand and the optical imaging arrangement containing a receiver dimming mechanism 16 surrounding the photo sensor 2 and the upstream receiver lens 15 on the other determine a scattered-light center SZ with a defined scattered light volume. Only scattered light from particles to be detected in this range SZ finally reaches the photo sensor 2.

In the present example, the light-emitting diode 1 according to the invention contains a first LED chip 3 embodied as a surface-emitting radiator to emit a first light bundle BL with light in a first wavelength range of from 350 nm to 500 nm, i.e. blue-green, blue, violet and ultraviolet light. The light-emitting diode 1 further contains a second LED chip 4 embodied as a surface-emitting radiator to emit a second light bundle RO with light in a second wavelength range of from 665 nm to 1000 nm, i.e. red/orange, red and infrared light. The two LED chips 3, 4 are arranged next to each other. The ratio of the optically active surface of the first LED chip 3 to the optically active surface of the second LED chip 4 is further according to the invention in a range of from 2 to 20, in particular in a range of from 2.5 to 6.5 (see in this context also FIG. 4).

On current excitation, the two LED chips 3, 4 emit two light bundles BL, RO, which for purposes of simplicity, are designated the blue light bundle BL and the red light bundle RO, through the side-by-side arrangement of the two LED chips 3, 4 and through the downstream optical lens 14 as part of the LED housing. The two light bundles BL, RO are not, as shown here for purposes of simplicity, sharply demarcated from each other. The edges of the two light bundles BL, RO are only intended to identify a sector within which the greatest part of the respective quantity of light is radiated, such as, for example, 95%. Therefore, there is also an overlap region in which the residual light of the emitted light is mixed with comparatively low light intensity.

In this context, consequently, the scattered-light center SZ shown in FIG. 1 is made up of a "blue" scattered-light center BZ, a "red" scattered-light center RZ and a common middle scattered-light center MZ there between.

In the present example, according to one embodiment, the diaphragm mechanism 12 is arranged and aligned such that the blue light bundle BL emitted by the first LED chip 3 passes substantially completely through the diaphragm aperture OF. On the other hand, the red light bundle RO emitted by the second LED chip 4 only passes partially, in the present example only half, through the diaphragm aperture OF.

Figure 2:
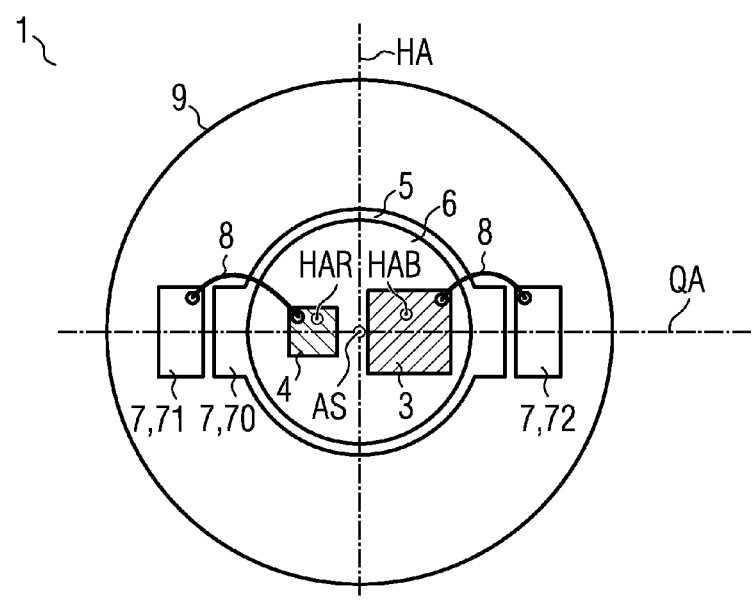
FIG. 2 is a diagrammatic, top plan view of the exemplary light-emitting diode shown in FIG. 1 with two integrated and differently sized LED chips to emit two-color light.

FIG. 2 shows a top view of the exemplary light-emitting diode 1 of FIG. 1 with two integrated and differently sized LED chips 3, 4 to emit (only) two-color light.

Reference number 9 designates the plastic housing in which a supporting plate 6 is cast as part of a reflector 5 with the two LED chips 3, 4. The reflector 5 is also embodied as a common terminal contact 7, 70 and led out of the housing 9 as a middle terminal contact. The middle terminal contact 70 is surrounded on both sides by a first and second terminal contact 71, 72, which are provided for electric connection with the two LED chips 3, 4. In the region of the supporting plate 6, the two terminal contacts 71, 72 each form a contacting surface for the contacting of the two LED chips 3, 4 therewith via bonding wires 8.

In the present example, AS designates the axis of symmetry extending perpendicular to the image plane. A vertical axis HA and a transverse axis QA are each plotted orthogonal to the axis and also orthogonal to each other.

According to the invention, the two LED chips 3, 4 are arranged next to each other. The ratio of the optically active surface of the first LED chip 3 to the optically active surface of the second LED chip 4 is within a range of from 2 to 20, in particular in a range of from 2.5 to 6.5. In the present example, the ratio is about $2.77=(0.5\times0.5 \text{ mm})^2/(0.3\times0.3 \text{ mm})^2$, wherein the side length of the two square LED chips 3, 4 shown by way of example have an edge length of 0.5 mm or 0.3 mm.

In FIG. 2 shown, the axis of symmetry AS extends between the two LED chips 3, 4. This is not vitally necessary. It can also extend through the larger of the two LED chips 3. HAR and HAB designate the two main directions of radiation of the two LED chips 3, 4. Geometrically, these correspond to the respective surface normals of the LED chips 3, 4 embodied as a surface-emitting radiator. In this example, the two main directions of radiation HAR, HAB extend parallel to each other and also parallel to the axis of symmetry AS.

FIG. 2 shows a top view of the exemplary light-emitting diode 1 of FIG. 1 with two integrated and differently sized LED chips 3, 4 to emit (only) two-color light, i.e. in accordance with the current control of the light-emitting diode 1 to emit single-color blue or red light or two-color blue and red light.

FIG. 3 shows the light-emitting diode 1 in FIG. 1 with an upstream alternative diaphragm mechanism 12, 13. In this embodiment, the diaphragm mechanism 12, 13 is arranged and aligned such that the light bundles BL, RO emitted by the two LED chips 3, 4 pass substantially completely through the diaphragm aperture OF.

Instead of the pinhole diaphragm 12 as the diaphragm mechanism 12, 13, alternatively to the pinhole diaphragm 12, it is also possible to use a bar 13 as a diaphragm for the light-emitting diode 1. For purposes of simplicity, the two variants are plotted jointly in FIG. 3.

According to the invention, a light plane LE extending through the axis of symmetry and transverse axis AS, QA is defined. A focus point F or focus lying on the axis of symmetry AS is optically defined by the optical lens 14 or by the optical lens unit. With the focus point F as the vertex, an angle of radiation a is defined that extends starting from the axis of symmetry AS within the light plane LE. A first dimming angle value $A_b$ and a second dimming angle value $A_r$ for the angle of radiation a are determined by two opposing inside edges of the diaphragm mechanism 12, 13, bounding the diaphragm aperture OF. The diaphragm mechanism 12, 13 is aligned and dimensioned such that the dimming angle values $A_b$, $A_r$ are of different sizes. In particular, they differ in size from each other by a factor of two to six. This asymmetric irradiation of the scattered light center SZ enables preference to be given to the poorly efficient "blue" light.

Figure 4:
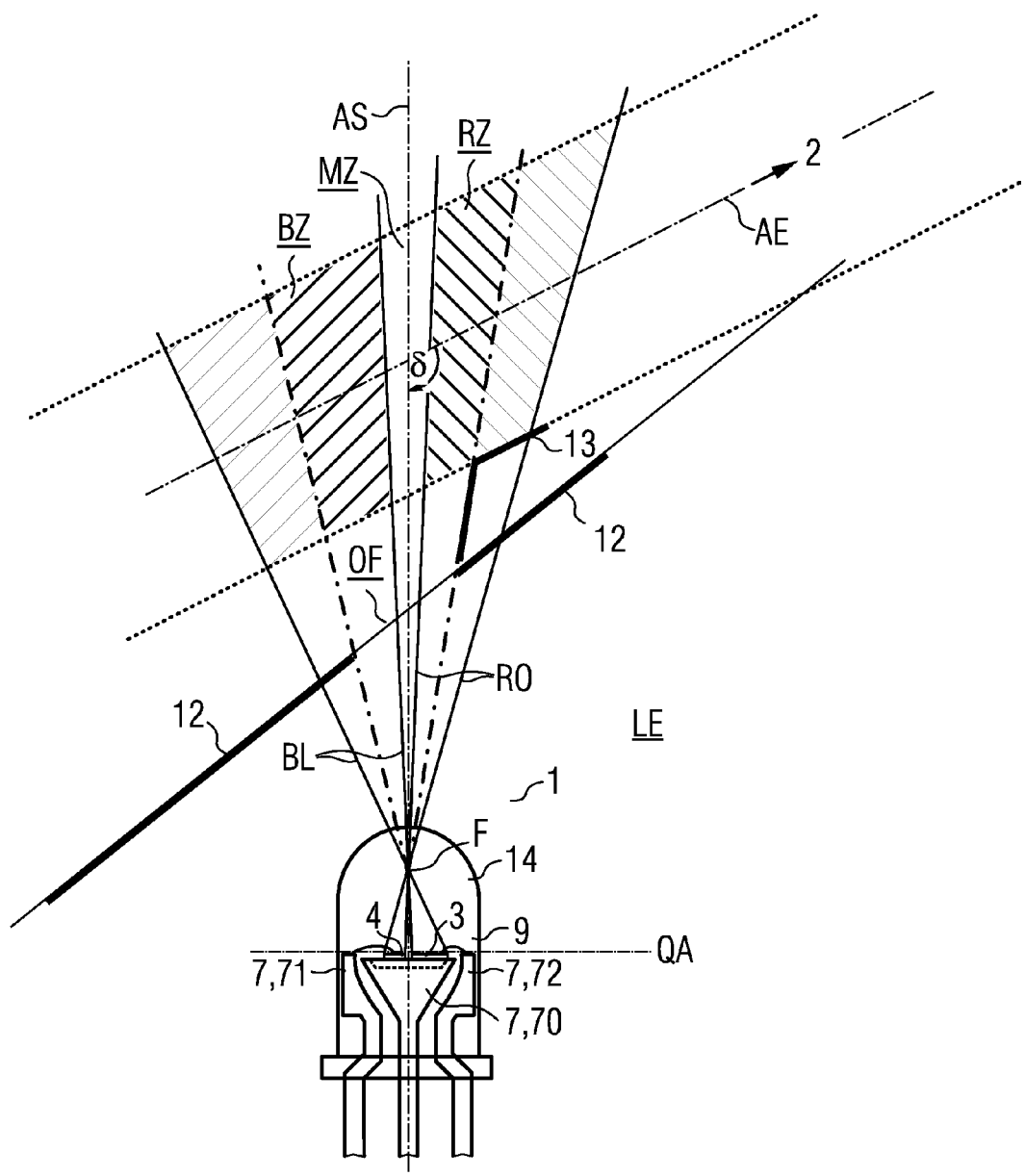
FIG. 4 is an illustration showing the light-emitting diode of FIG. 1 with an upstream further alternative diaphragm mechanism.

FIG. 4 shows the light-emitting diode 1 of FIG. 1 with an upstream further alternative diaphragm mechanism 12, 13.

According to this embodiment, the diaphragm mechanism 12, 13 is arranged and aligned such that the blue light bundle BL emitted by the first LED chip 3 and the red light bundle RO emitted by the second LED chip 4 passes only partially, in particular less than 75%, through the diaphragm aperture OF. In the present example only about half of the respective irradiated light passes through the diaphragm aperture OF.

Figure 5:
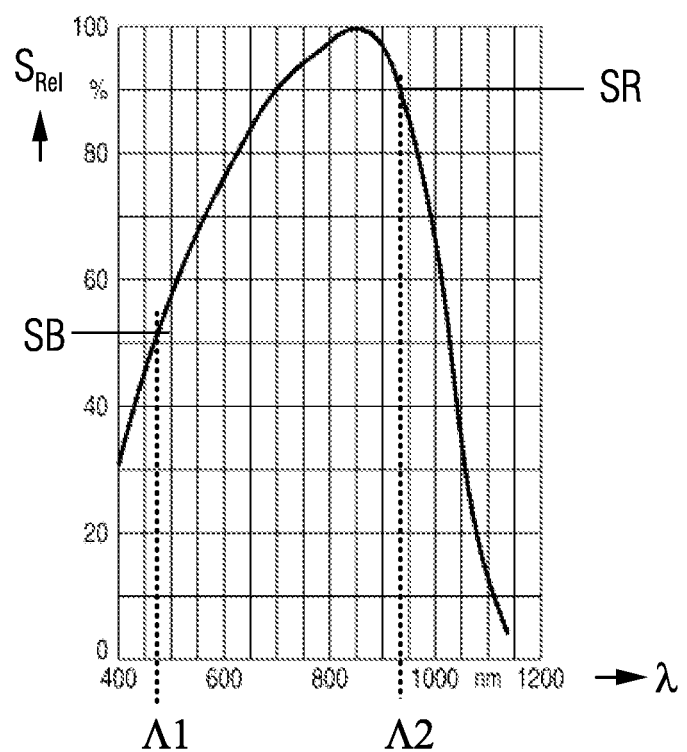
FIG. 5 is a graph showing an example of the specific spectral sensitivity of a silicon PIN photodiode with increased blue sensitivity.

FIG. 5 shows an example of the specific spectral sensitivity $S_{Rel}$ of Silicon PIN photodiode 2 with increased blue sensitivity. The light-wave length λ of the detected light is plotted over the abscissa in nanometers, the specific spectral sensitivity $S_{Rel}$ is plotted over the ordinate using the example of a silicon PIN photodiode of the type BPW34B made by the company OSRAM as percentages. The spectral sensitivity $S_{Rel}$ is standardized with a 100% value to the spectrally most sensitive light-wave length at 850 nm.

As the diagram shows, with a wave-length value Λ1 of 470 nm with 52%, the spectral "blue" sensitivity SB of the photosensor 2 for blue light is about 1.7 times worse than the spectral "red" sensitivity SR of the photosensor 2 for infrared light with a wave-length value Λ2 of 940 nm with 90%.

The following is a summary list of reference numerals and the corresponding structure used in the above description of the invention:

1 LED, light-emitting diode
2 photosensor, semiconductor photodiode, silicon PIN photodiode
3, 4 LED chip, surface-emitting radiator
5 reflector, reflector ring
6 support, supporting plate
7 terminal contact
8 bonding wires
9 housing, plastic housing
10 detector unit
11 louvre, light-shield element
12 diaphragm mechanism, pinhole diaphragm
13 diaphragm mechanism, bar
14 optical lens
15 receiver lens
16 receiver dimming device, pinhole diaphragm
70 common terminal contact
71 first terminal contact
71, 72 contact surfaces
72 second terminal contact
AE optical axis of the receiver
AS axis of symmetry of the LED, main longitudinal axis
BL light bundle, "blue" light bundle
BZ ("blue") scattered-light center
F focus point, focus
HA vertical axis
HAB ("blue") main direction of radiation
HAR ("red") main direction of radiation
LE light plane
MZ middle scattered-light center
OF diaphragm aperture
QA transverse axis
RO light bundle, "red" light bundle
RZ ("red") scattered-light center
SB ("blue") spectral sensitivity
SR ("red") spectral sensitivity
SZ scattered-light center
$S_{Rel}$ relative spectral sensitivity
α angle of radiation
$A_b$ ("blue") dimming angle value
$A_r$ ("red") dimming angle value
β shielding angle
δ scattered light angle
λ light-wave length
Λ1 first wave-length value
Λ2 second wave-length value

The invention claimed is:

1. An optical smoke alarm, comprising:
a detector unit working according to a scattered light principle;
a light-emitting diode for irradiating particles to be detected and disposed in said detector unit, said light-emitting diode having a first LED chip being a surface-emitting radiator for emitting a first light bundle with light in a first wavelength range of 350 nm to 500 nm, said light-emitting diode having a second LED chip being a surface-emitting radiator for emitting a second light bundle with light in a second wavelength range of 665 nm to 1000 nm, said first and second LED chips are disposed next to each other, a ratio of an optically active surface of said first LED chip to an optically active surface of said second LED chip being within a range of 2 to 20; and a spectrally sensitive photosensor to detect light scattered by the particles, said spectrally sensitive photosensor disposed in said detector unit.

2. The optical smoke alarm according to claim 1, wherein the ratio of said optically active surface of said first LED chip to said optically active surface of said second LED chip is within a range of 2.5 to 6.5.

3. The optical smoke alarm according to claim 1, wherein said first LED chip is embodied to emit light with a wavelength of 460 nm±40 nm or 390 nm±40 nm, and said second LED chip to emit light with a wavelength of 940 nm±40 nm or 860 nm±40 nm.

4. The optical smoke alarm according to claim 1, wherein said light-emitting diode has an axis of symmetry and a respective main direction of radiation of said first and second LED chips is parallel toward the axis of symmetry.

5. The optical smoke alarm according to claim 1, wherein said light-emitting diode has an axis of symmetry, said first and second LED chips each have a main direction of radiation and at least one of the main directions of radiation is inclined toward the axis of symmetry.

6. The optical smoke alarm according to claim 1, further comprising a diaphragm mechanism having a diaphragm aperture formed therein and is disposed in said detector unit between said light-emitting diode and said spectrally sensitive photosensor, said diaphragm mechanism is disposed and aligned such that the first and second light bundles emitted by said first and second LED chips pass substantially completely through said diaphragm aperture.

7. The optical smoke alarm according to claim 1, further comprising a diaphragm mechanism having a diaphragm aperture formed therein and disposed in said detector unit between said light-emitting diode and said spectrally sensitive photosensor, said diaphragm mechanism is disposed and aligned such that less than 75% of the first light bundle emitted by said first LED chip and less than 75% of the second light bundle emitted by said second LED chip pass through said diaphragm aperture.

8. The optical smoke alarm according to claim 1, further comprising a diaphragm mechanism having a diaphragm aperture formed therein and disposed in said detector unit between said light-emitting diode and said spectrally sensitive photosensor, said diaphragm mechanism is disposed and aligned such that one of the first and second light bundles emitted by one of said first and second LED chips passes substantially completely through said diaphragm aperture, while less than 75% of the light bundle emitted by the other one of said first and second LED chips passes through said diaphragm aperture.

9. The optical smoke alarm according to claim 6, wherein said light-emitting diode has an axis of symmetry and said light-emitting diode is disposed about the axis of symmetry such that the light emitted by said second LED chip is directed more toward said spectrally sensitive photosensor than the light emitted by said first LED chip.

10. The optical smoke alarm according to claim 9, wherein:

said light-emitting diode has a housing made of a transparent plastic;

said housing forms an optical lens along a region around a light outlet from said first and second LED chips; and/or an optical lens unit is disposed between said light-emitting diode and said diaphragm aperture.

11. The optical smoke alarm according to claim 10, wherein:

said light-emitting diode has a transverse axis extending perpendicular toward the axis of symmetry and through said first and second LED chips disposed next to each other, a light plane extending through the axis of symmetry and the transverse axis is defined;

said optical lens or said optical lens unit optically defines a focus point lying on the axis of symmetry, wherein, with the focus point as a vertex, an angle of radiation is defined that extends starting from the axis of symmetry within the light plane, wherein a first dimming angle value and a second dimming angle value are determined for the angle of radiation by two opposing inside edges of said diaphragm mechanism bounding said diaphragm aperture; and said diaphragm mechanism is aligned and dimensioned such that the first and second dimming angle values are of different sizes.

12. The optical smoke alarm according to claim 11, wherein said diaphragm mechanism is aligned and dimensioned such that the first and second dimming angle values differ in size from each other by a factor of two to six.

13. The optical smoke alarm according to claim 1, further comprising an electronic control unit connected to said light-emitting diode and to said spectrally sensitive photosensor, said electronic control unit is configured to output a warning and/or an alarm when a minimum concentration value of smoke can be detected.

14. The optical smoke alarm according to claim 13, wherein said electronic control unit is configured to control said first LED chip with a specified nominal current and said electronic control unit is configured to control said second LED chip with a reduction factor that can be defined in comparison with the specified nominal current.

15. The optical smoke alarm according to claim 14, wherein the reduction factor is defined by a different spectral sensitivity of said spectrally sensitive photosensor for scattered light to be detected in the first and second wavelength ranges.

16. The optical smoke alarm according to claim 1, wherein said spectrally sensitive photosensor is a silicon PIN photodiode.

17. The optical smoke alarm according to claim 13, wherein said first and second LED chips can be controlled by said electronic control unit with alternate pulsing or simultaneous pulsing.

* * * * *